US012610797B2

(12) United States Patent
Sung et al.

(10) Patent No.: US 12,610,797 B2
(45) Date of Patent: Apr. 21, 2026

(54) WAFER STACKING PROCESS

(71) Applicant: Powerchip Semiconductor Manufacturing Corporation, Hsinchu (TW)

(72) Inventors: Chih-Feng Sung, Hsinchu (TW); Chih-Hao Chuang, Hsinchu (TW); Chun-Lin Lu, Hsinchu (TW); Shih-Ping Lee, Hsinchu (TW); Li-Han Chiu, Hsinchu (TW); Yi-Kai Wu, Hsinchu (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 384 days.

(21) Appl. No.: 18/500,106

(22) Filed: Nov. 1, 2023

(65) Prior Publication Data

US 2025/0029949 A1 Jan. 23, 2025

(30) Foreign Application Priority Data

Jul. 21, 2023 (TW) .................................. 112127300

(51) Int. Cl.
| | |
|---|---|
| *H01L 23/00* | (2006.01) |
| *H10W 20/00* | (2026.01) |
| *H10W 20/20* | (2026.01) |
| *H10W 80/00* | (2026.01) |

(52) U.S. Cl.
CPC ........... *H10W 20/01* (2026.01); *H10W 20/20* (2026.01); *H10W 80/312* (2026.01); *H10W 80/327* (2026.01)

(58) Field of Classification Search
CPC ... H10W 20/01; H10W 20/20; H10W 80/312; H10W 80/327; H01L 21/76898; H01L 23/481; H01L 21/768; H01L 2224/80895; H01L 2224/80896
See application file for complete search history.

(56) References Cited

U.S. PATENT DOCUMENTS

| | | | |
|---|---|---|---|
| 2017/0186730 A1 | 6/2017 | Shen | |
| 2017/0323853 A1* | 11/2017 | Hu | ...................... H01L 23/5383 |
| 2022/0293552 A1* | 9/2022 | Lo | ........................ H01L 25/0657 |
| 2023/0061189 A1* | 3/2023 | Lo | ............................ H01L 25/50 |
| 2023/0335441 A1* | 10/2023 | Maehara | ................. H01L 25/50 |

FOREIGN PATENT DOCUMENTS

| | | |
|---|---|---|
| CN | 113517203 A | 10/2021 |
| TW | 202236515 A | 9/2022 |

* cited by examiner

*Primary Examiner* — Mohammed R Alam
(74) *Attorney, Agent, or Firm* — Winston Hsu

(57) ABSTRACT

A wafer stacking process is provided in the present invention, including steps of forming a silicon oxide layer on a sacrificial carrier, bonding the silicon oxide layer with a dielectric layer on a front side of a silicon substrate, performing a thinning process on the back side of the silicon substrate to expose TSVs therewithin, bonding the back side of the silicon substrate with another silicon substrate, repeating the thinning process and the process of bonding another silicon substrate above so as to form a wafer stacking structure, and performing a removing process to completely remove the sacrificial carrier.

10 Claims, 10 Drawing Sheets

510

500

210'
208

202

200

300

400

WAFER STACKING PROCESS

BACKGROUND OF THE INVENTION

1. Field of the Invention

The present invention relates generally to a wafer stacking process, and more specifically, to a wafer stacking process adopting oxide-to-oxide bonding.

2. Description of the Prior Art

In the semiconductor field nowadays, since the factors like constraint and physical limit in the process, it becomes increasingly difficult to scale down semiconductor devices and increase device density. In order to set more devices in limited layout area, 3D IC technology emerges accordingly to vertically integrate multiple chips in 3D space, featuring the method of setting or forming various chips on the same layout area in stacking way. In addition to significantly increase device density in the same layout area, the integration of various chips with different properties and functions may also substantially simplify the whole process and improve the performance of devices, and certain advance applications may also be implemented at the same time, such as artificial intelligence CMOS image sensor (AI CIS) and in-memory computing.

Wafer bonding is one of critical steps in various 3D IC technology, wherein multiple aligned and stacked wafers are bonded with each other to achieve the vertical integration of multiple wafers in 3D space. Through-silicon via (TSV) may function as a vertical interconnect to connect the circuits and devices in these wafers. Current wafer stacking process usually fixes the device wafer to be bonded temporarily on a carrier through adhesive, in order to provide supporting basis during the bonding process, and the carrier will be removed after the device wafer is bonded with another wafer. Generally, carrier may be removed through conventional approach like thermal sliding, mechanical peeling or laser debonding. These methods all have their obvious disadvantages. For example, thermal sliding is confined by the limitation of process temperature (ex. <250° C.), mechanical peeling is possible to damage thin wafer, and laser debonding is limited in the use that the carrier is transparent glass substrate, and it is also highly mismatching in the coefficient of thermal expansion against silicon wafer and easy to cause abnormal alarm in current process tools, such as unable to align due to transparency or E-chuck failure due to distinct conductivities. Accordingly, those of skilled in thee art still need to improve current wafer bonding process, in hope of integrating more wafers into 3D IC architecture.

SUMMARY OF THE INVENTION

In light of the aforementioned advantages in conventional skills, the present invention hereby provides a novel wafer stacking process, with feature of adopting oxide-to-oxide bonding rather than adhesive method, and carrier is grinded out or etched directly through physical method rather than peeled off from the adhesive interface, disadvantages or limitations of the removing methods through thermal, mechanical or laser approach in conventional skill may not exist.

One aspect of the present invention is to provide a wafer stacking process, including steps of: providing a sacrificial carrier; forming a silicon oxide layer on a front side of the sacrificial carrier; providing a silicon substrate, wherein the silicon substrate is provided with through silicon vias (TSVs), and back-end-of-line (BEOL) interconnects and a dielectric layer are provided on a front side of the silicon substrate; bonding said silicon oxide layer on the front side of the sacrificial carrier with the dielectric layer on the front side of the silicon substrate; performing a thinning process on a back side of the silicon substrate to remove parts of the silicon substrate and expose the TSVs inside; bonding the back side of the silicon substrate with a front side of another silicon substrate, wherein the TSVs exposed from the back side of the silicon substrate are electrically connected with BEOL interconnect on the front side of the another silicon substrate; repeating the aforementioned thinning process and process of bonding another silicon substrate, thereby forming a wafer stacking structure; and performing a removing process on a back side of the sacrificial carrier to completely remove the sacrificial carrier.

Another aspect of the present invention is to provide a wafer stacking process, including steps of: providing a sacrificial carrier; forming a silicon oxide layer on a front side of the sacrificial carrier; providing a silicon substrate, wherein through silicon vias (TSVs) are formed in the silicon substrate, and back-end-of-line (BEOL) interconnects and a dielectric layer are provided on a front side of the silicon substrate; bonding the silicon oxide layer on the front side of the sacrificial carrier with the dielectric layer on the front side of the silicon substrate; performing a thinning process on a back side of the silicon substrate to remove parts of the silicon substrate and expose the TSVs inside, wherein the sacrificial carrier and the silicon substrate after bonding form a wafer bonding unit, and a front side of the wafer bonding unit is provided with exposed the TSVs and a back side of the wafer bonding unit is a back side of the sacrificial carrier; bonding the front side of the wafer bonding unit with a front side of another silicon substrate, wherein the TSVs exposed from the front side of the wafer bonding unit are electrically connected with BEOL interconnects on the front side of the another silicon substrate; completely removing the sacrificial carrier on the back side of the wafer bonding unit; forming a redistribution layer on the dielectric layer of the silicon substrate or on said silicon oxide layer of the sacrificial carrier to connect the BEOL interconnects on the front side of the silicon substrate; bonding another wafer bonding unit on the redistribution layer, wherein the redistribution layer is electrically connected with TSVs of the another wafer bonding unit; and repeating the aforementioned processes of removing sacrificial carrier, forming a redistribution layer and bonding another wafer bonding unit, thereby forming a wafer stacking structure.

These and other objectives of the present invention will no doubt become obvious to those of ordinary skill in the art after reading the following detailed description of the preferred embodiment that is illustrated in the various figures and drawings.

Figure 1:
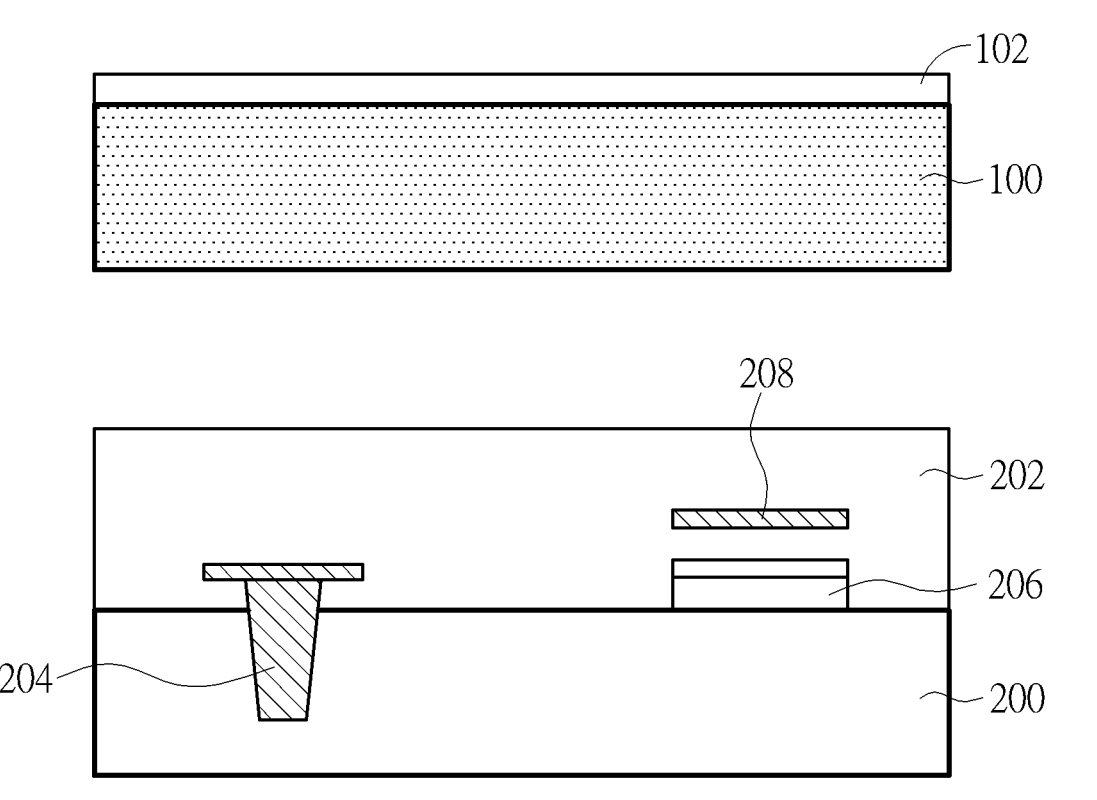
FIGS. 1-7 are schematic cross-sectional views showing a wafer stacking process in accordance with one embodiment of the present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

Reference will now be made in detail to exemplary embodiments of the invention, which are illustrated in the accompanying drawings in order to understand and implement the present disclosure and to realize the technical effect. It can be understood that the following description has been made only by way of example, but not to limit the present disclosure. Various embodiments of the present disclosure and various features in the embodiments that are not conflicted with each other can be combined and rearranged in various ways. Without departing from the spirit and scope of the present disclosure, modifications, equivalents, or improvements to the present disclosure are understandable to those skilled in the art and are intended to be encompassed within the scope of the present disclosure.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something). Further, spatially relative terms, such as "beneath," "below," "lower," "above," "upper," and the like, may be used herein for ease of description to describe one element or feature relationship to another element(s) or feature(s) as illustrated in the figures.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon (Si), germanium (Ge), gallium arsenide (GaAs), indium phosphide (InP), etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or through holes are formed) and one or more dielectric layers.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. Additionally, the term "based on" may be understood as not necessarily intended to convey an exclusive set of factors, but may allow for the presence of other factors not necessarily expressly described, again depending at least in part on the context.

It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

FIG. 1 to FIG. 7 will now be referred sequentially hereinafter to describe the wafer stacking process in accordance with one embodiment of the present invention. The wafer stacking structure formed by the method of present invention is generally comprised of multiple silicon substrates and device layers and interconnection layers formed thereon, which are bonded together through hybrid bonding process and are connected with each other through through-silicon-vias (TSVs) to achieve 3D IC integration, which is particularly suitable for the computing operation in the field of artificial intelligence (AI) and high performance computing (HPC). Please note that in the embodiment of present invention, a front side of device wafer is the side with semiconductor devices and BEOL (back-end-of-line) interconnects formed thereon, while the back side is usually a surface of silicon substrate or a redistribution layer formed thereon. In addition, the carrier used in the embodiment of present invention is sacrificial, meaning it will be completely grinded or etched out through physical method in the process, rather than peeled off from the adhesive interface.

Please refer to FIG. 1. In the beginning of process, a sacrificial carrier 100 is first provided as a supporting basis of device wafer in the bonding process. In the embodiment of present invention, the sacrificial carrier 100 may be a silicon substrate or glass substrate with a silicon oxide layer 102 formed thereon as a bonding layer through deposition process or thermal oxidation process. The silicon oxide layer 102 formed by deposition process may be PETEOS (plasma-enhanced tetraethoxysilane), while the silicon oxide layer 102 formed by thermal oxidation process requires a silicon substrate as the sacrificial carrier 100. The silicon oxide layer 102 formed by thermal method is more compact and has higher bonding force. In another aspect, a device wafer for wafer stacking, ex. a logic wafer, is provided, which may include a silicon substrate 200 with TSVs 204 formed therein, ex. via middle TSVs. Structures like semiconductor devices 206 (ex. CMOS device or memory), dielectric layer 202 (ex. inter-metal dielectric IMD) and BEOL interconnect 208 formed in the dielectric layer 202 are formed on the front side of the silicon substrate 200 through FEOL (front-end-of-line) process and BEOL process.

Figure 2:
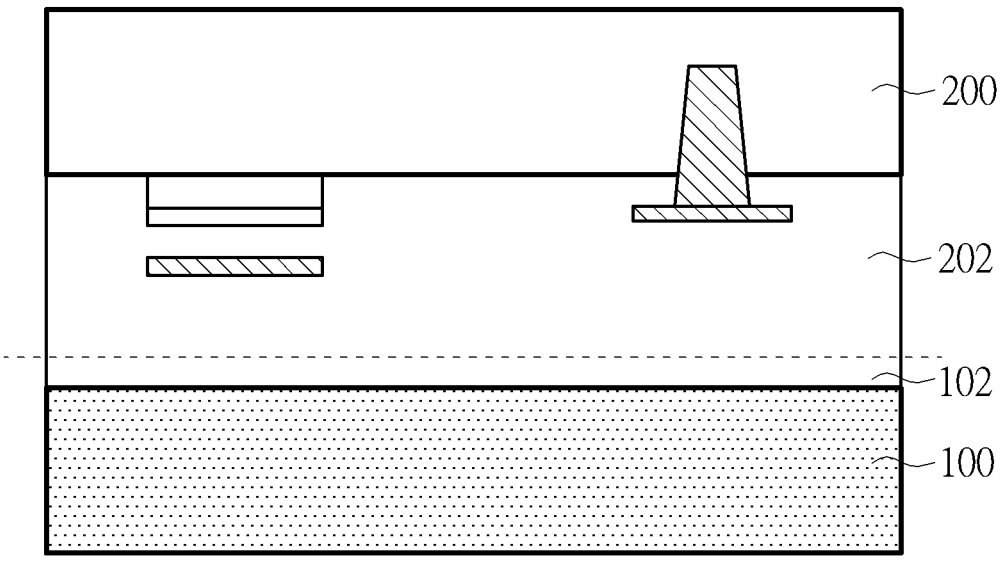

Please refer to FIG. 2. After the aforementioned sacrificial carrier 100 and device wafers are prepared, bonding the silicon oxide layer 102 on the front side of sacrificial carrier 100 with the dielectric layer 202 on the front side of the silicon substrate 200. Different from the approach of conventional skill using adhesive to bond carriers, please note that the present invention adopts oxide-to-oxide bonding method, i.e. the aforementioned silicon oxide based dielectric layer 202 on the silicon substrate 200 bonded with the silicon oxide layer 102 on the sacrificial carrier 100. Fusion bonding method may be adopted to achieve the bonding therebetween through van der waals force between homogeneous materials. The silicon oxide based layers at two sides of the bonding interface may be PETEOS layer and thermal oxide layer respectively, but not limited thereto.

Figure 3:
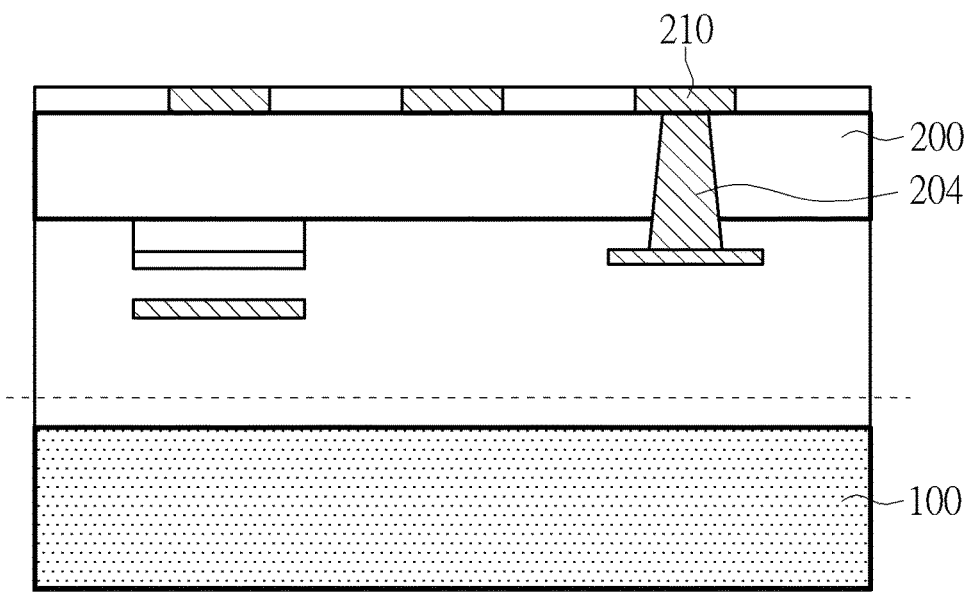

Please refer to FIG. 3. After the sacrificial carrier 100 and the silicon substrate 200 are bonded, a thinning process is then performed on the back side of silicon substrate 200, ex. a chemical mechanical planarization (CMP) process, to remove parts of the silicon substrate 200 and expose the TSVs 204 inside. Furthermore, After TSVs 204 are exposed, a redistribution layer 210 is then formed on the back side of the thinned substrate after TSVs 204 are exposed, which is electrically connected with the TSVs 204 in the silicon substrate 200, to redistribute the I/O positions of circuits on the silicon substrate 200 and provide necessary bonding interface in later process.

Figure 4:
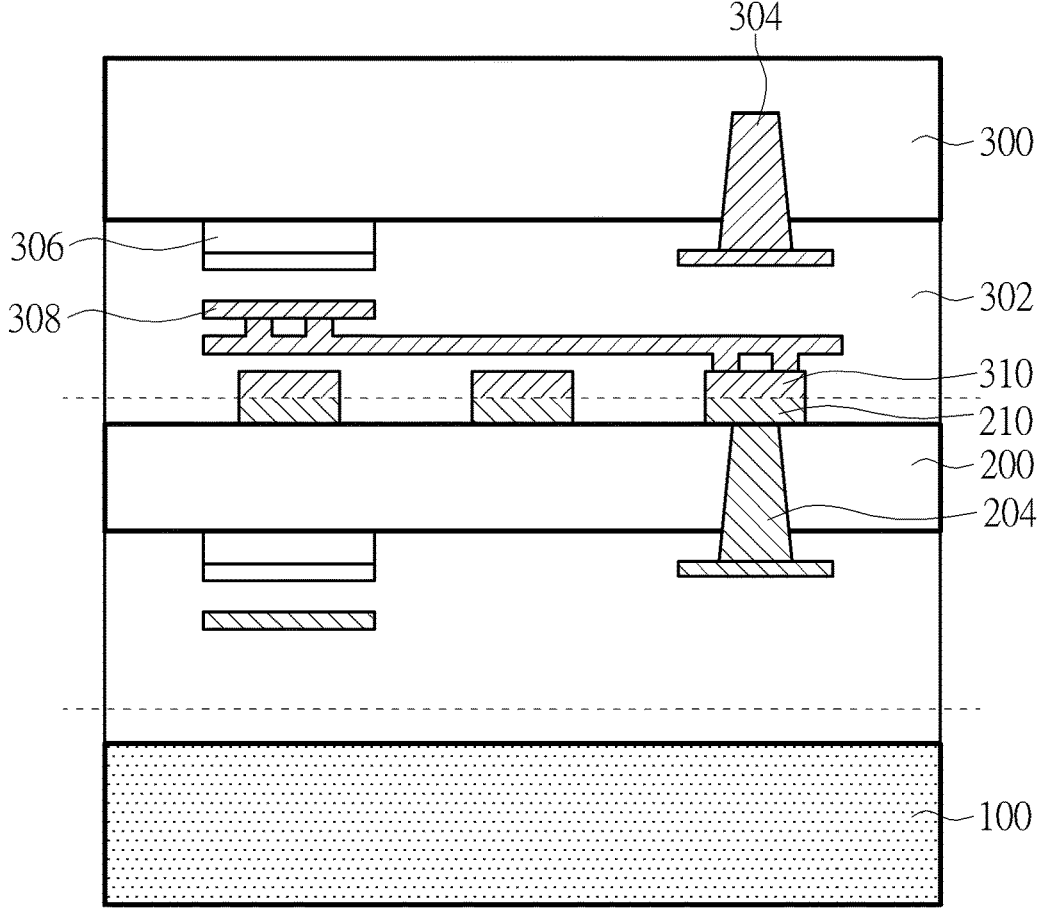

Please refer to FIG. 4. After the backside thinning process and the formation of redistribution layer 210, the redistribution layer 210 on the back side of silicon substrate 200 is bonded with the front side of another silicon substrate 300. Similarly, structures like semiconductor devices 306 (ex. CMOS device or memory), dielectric layer 302 (ex. IMD) and BEOL interconnect 308 formed in the dielectric layer 302 are formed on the front side of silicon substrate 300 through FEOL process and BEOL process, and a redistribution layer 310 corresponding to the redistribution layer 210 of silicon substrate 200 is further formed on the surface to bonded therewith. In this step, the bonding between redistribution layer 210 and redistribution layer 310 may adopt metal thermal-compression bonding, to soften and connect the copper based connecting parts in the redistribution layers, while the other dielectric parts of the redistribution layers are bonded through fusion bonding method at the same time. In this way, the semiconductor devices and circuits on the silicon substrate 200 may be electrically connected with the BEOL interconnects 308 and semiconductor devices 306 on the silicon substrate 300 through its TSVs 204.

Figure 5:
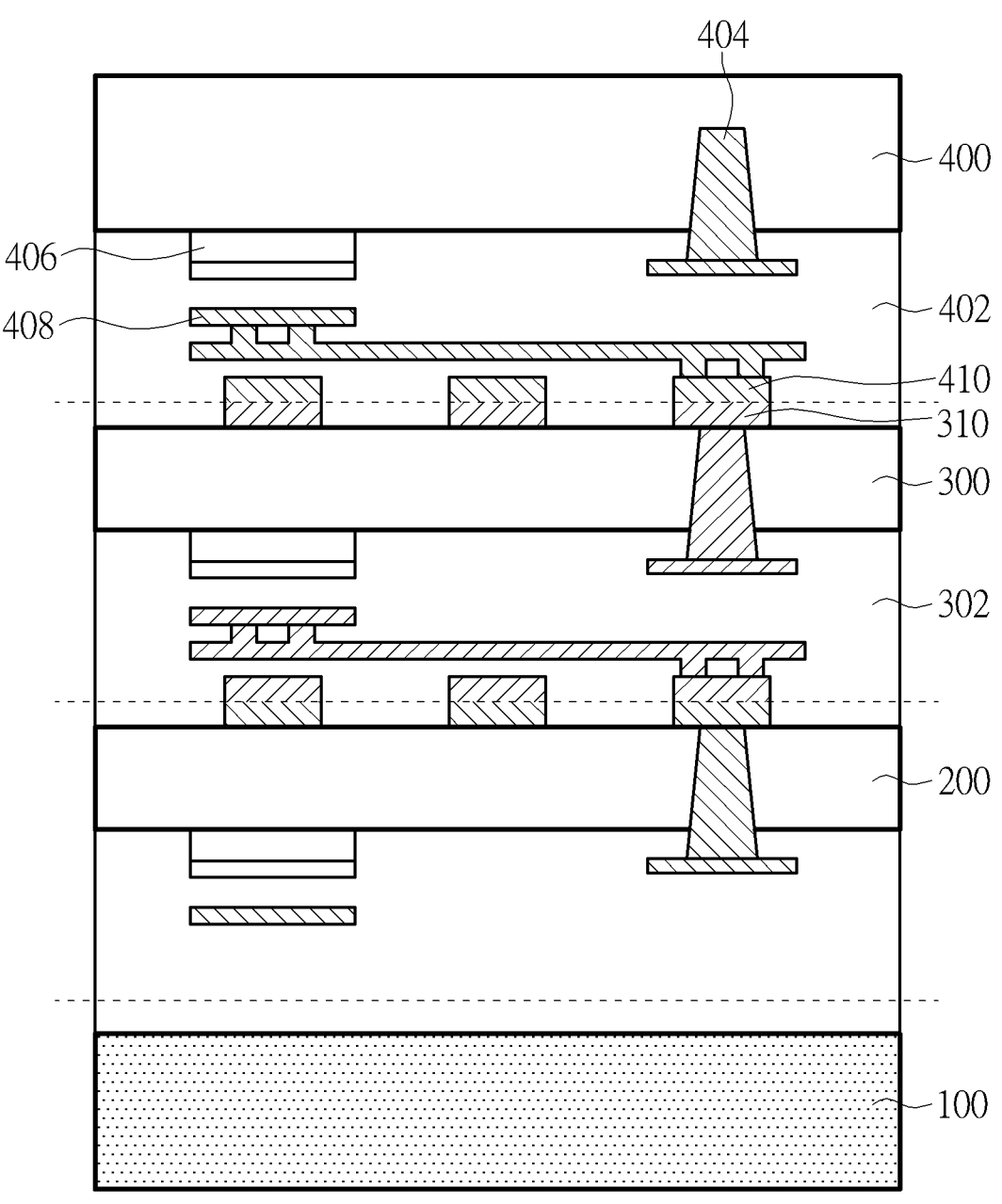

Please refer to FIG. 5. After bonding the silicon substrate 200 and silicon substrate 300 as above, the aforementioned thinning process in FIG. 3 and the step of bonding another silicon substrate in FIG. 4 are then repeated to bond more silicon substrates, ex. silicon substrate 400, on the silicon substrate 300. Structures like semiconductor devices 406, dielectric layer 402, BEOL interconnect 408 and redistribution layer 410 are also formed on the front side of the substrate, and TSVs 404 may also be formed within. In this way, a wafer stacking structure is therefore constituted. Please note that the number of bondable silicon substrate is not limited. The embodiment in FIG. 5 only shows three silicon substrates 200, 300, 400 as an example.

Figure 6:
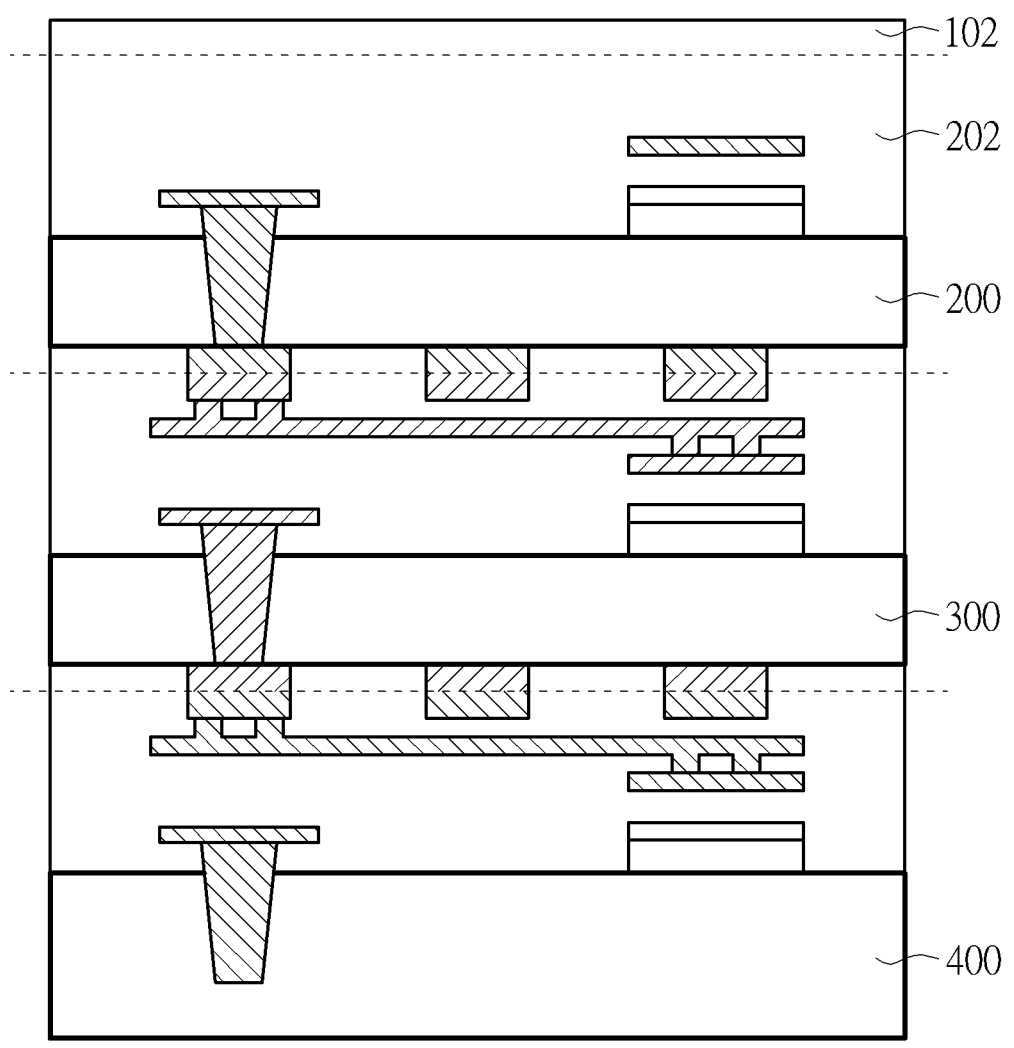

Please refer to FIG. 6. After all silicon substrates are bonded, the entire wafer stacking structure is flipped to make the back side of sacrificial carrier 100 facing up, so that a removing process may be performed to remove the unnecessary sacrificial carrier 100. Please note that in the embodiment of present invention, the removing process is performed on the back side of sacrificial carrier 100 (the side opposite to the silicon oxide layer 102), which may be a CMP process, wet etching process or dry etching process, to completely remove the sacrificial carrier 100 and stop on the silicon oxide layer 102. In certain embodiments, the silicon oxide layer 102 may also be removed in this process.

Figure 7:
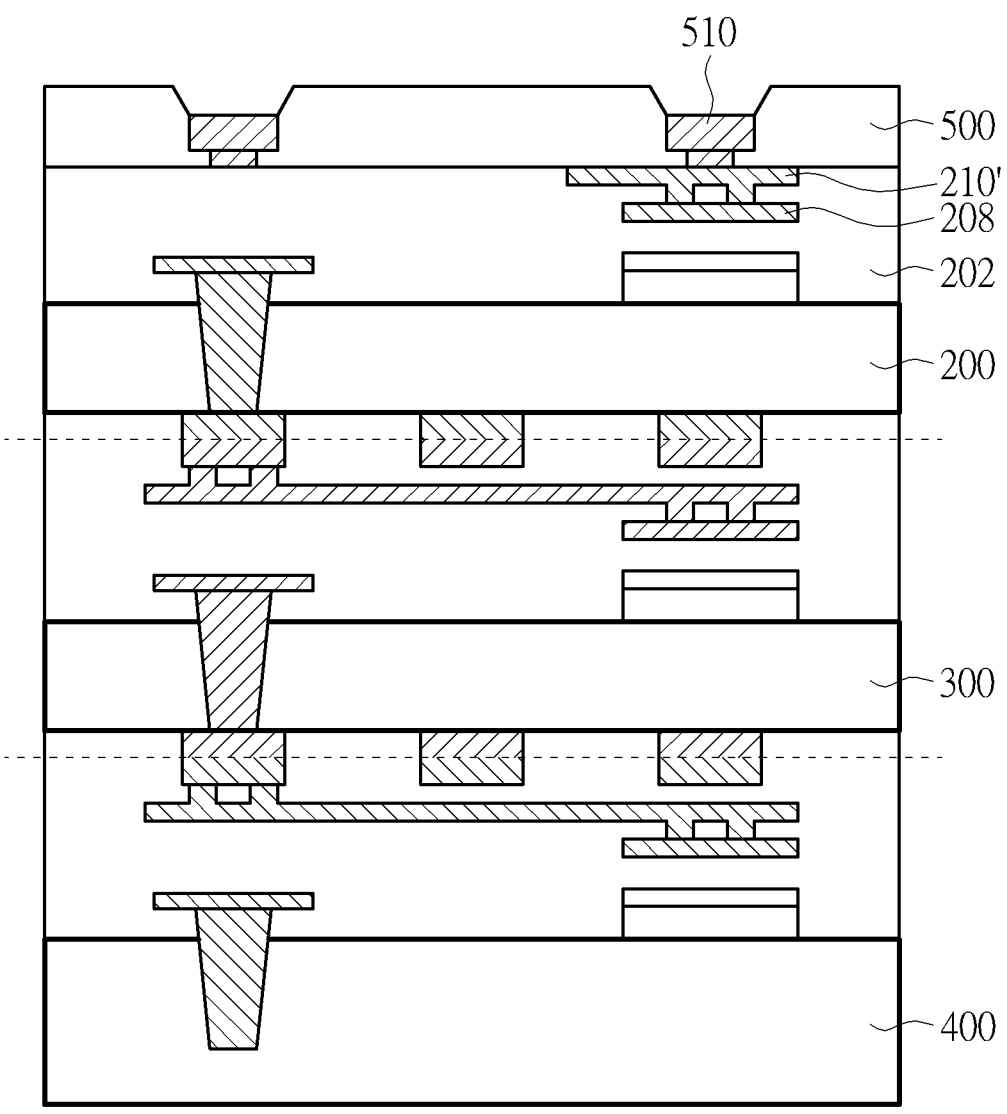

Please refer to FIG. 7. After the sacrificial carrier 100 is removed, circuit output of the entire wafer stacking structure is then manufactured. As shown in figure, a redistribution layer 210' is formed in or on the silicon oxide layer 102 or the topmost dielectric layer 202 (in the case that the silicon oxide layer 102 is removed). Contact pads 510 may be further manufactured on the redistribution layer 210' to function as final circuit outputs of the wafer stacking structure. A passivation layer 500 may be further formed on the outermost surface of the wafer stacking structure to provide protection effect. Accordingly, the wafer stacking process of present invention is therefore completed.

It can be known from the aforementioned embodiment that, the present invention adopts oxide-to-oxide bonding rather than conventional adhesive method to bond a sacrificial carrier and device wafers, and the sacrificial carrier is grinded or etched out directly through physical method, rather than peeled off from the adhesive interface, so that disadvantages or limitations of the removing methods through thermal, mechanical or laser approach in conventional skill may not exist.

FIG. 8 to FIG. 14 will now be referred sequentially hereinafter to describe the wafer stacking process in accordance with another embodiment of the present invention.

Figure 8:
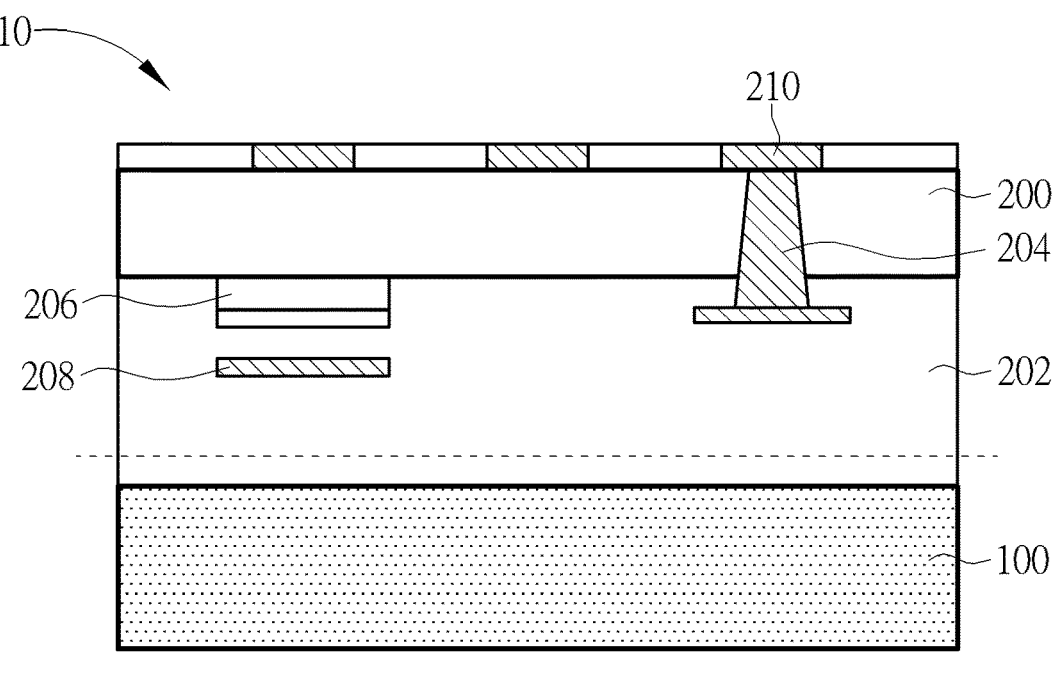
FIGS. 8-14 are schematic cross-sectional views showing a wafer stacking process in accordance with another embodiment of the present invention.

Please refer to FIG. 8. The structure shown in FIG. 8 is identical to the structure shown in FIG. 3, including bonded sacrificial carrier 100 and silicon substrate 200. TSVs 204 are formed in silicon substrate 200, with semiconductor devices 206, dielectric layer 202 and BEOL interconnect 208 in the dielectric layer 202 are formed on its front side through FEOL process and BEOL process. The back side of silicon substrate 200 is thinned and with a redistribution layer 210 formed thereon to electrically connect the TSVs 204 therewithin. Please note that the entire structure including the sacrificial carrier 100 above is defined as a wafer bonding unit 10 in this embodiment, which is an unit stacked in every wafer stacking process later.

Figure 9:
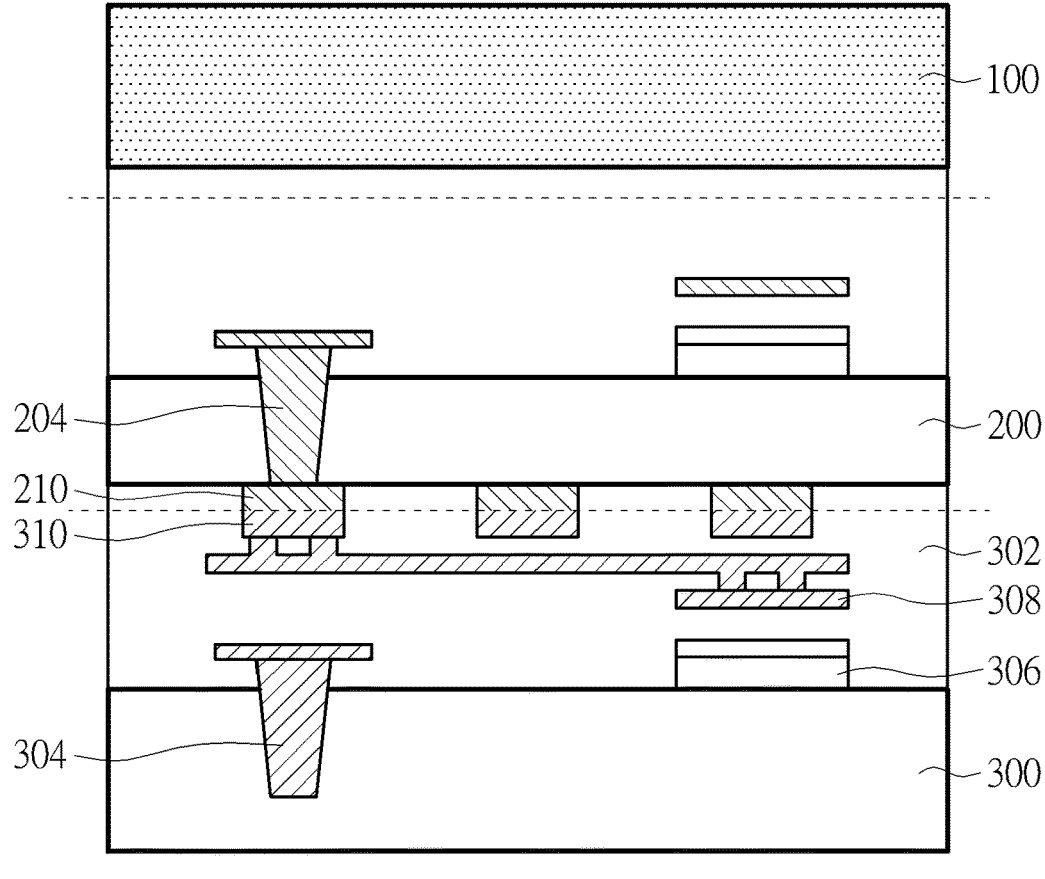

Please refer to FIG. 9. Similar to the step of FIG. 4, the aforementioned wafer bonding unit 10 is bonded with the front side of another silicon substrate 300. Structures like semiconductor devices 306, dielectric layer 302, BEOL interconnect 308 and redistribution layer 310 are also formed on the front side of silicon substrate 300 through FEOL process and BEOL process, and TSVs 304 may also be formed therewithin. The bonding between redistribution layer 210 and redistribution layer 310 also adopts metal thermal-compression bonding. In this way, the semiconductor devices and circuits on the silicon substrate 200 may be electrically connected with the BEOL interconnect 308 and semiconductor devices 306 on the silicon substrate 300 through TSVs 204.

Figure 10:
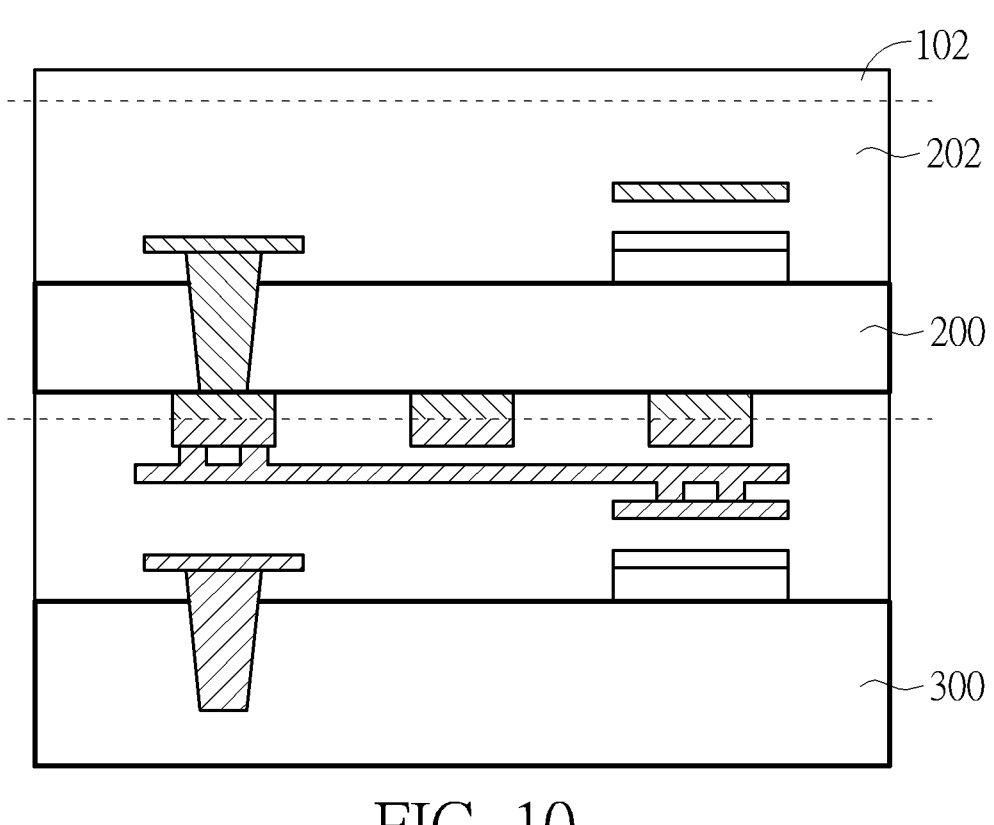

Please refer to FIG. 10. After bonding the wafer bonding unit 10 and the silicon substrate 300, different from the previous embodiment, the sacrificial carrier 100 on the silicon substrate 200 will be removed in this stage in this embodiment, rather than been removed after all silicon substrates are bonded. The removal of sacrificial carrier 100 is also performed from the back side, which may adopt CMP process, wet etching process or dry etching process and stop on a silicon oxide layer 102. In certain embodiments, the silicon oxide layer 102 may also be removed in this process.

Figure 11:
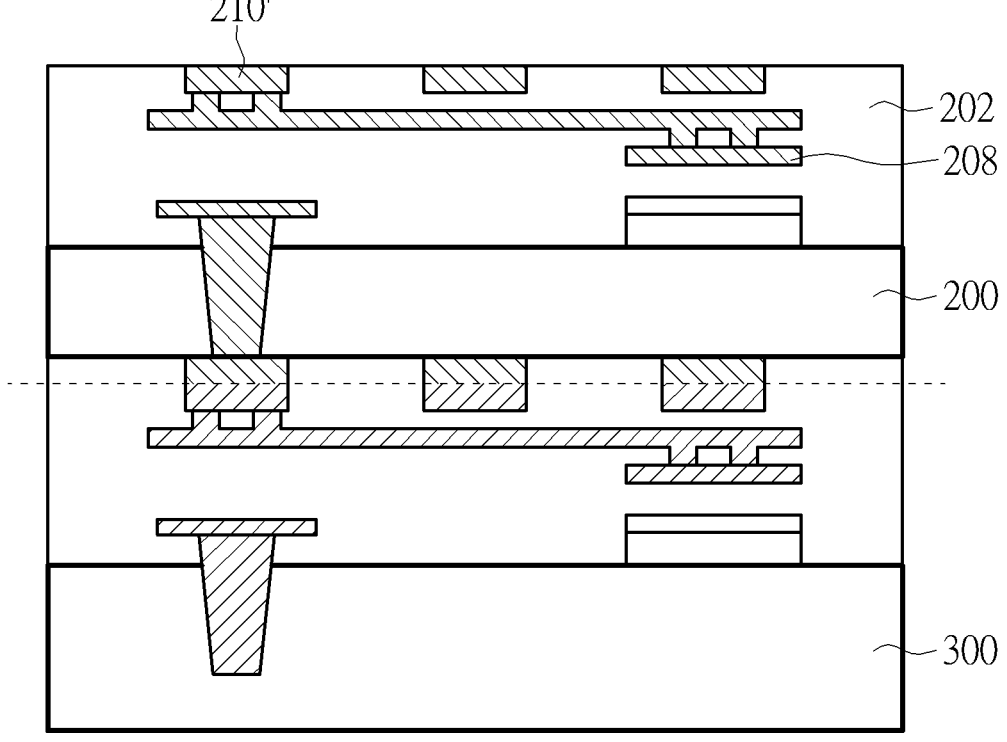

Please refer to FIG. 11. After the sacrificial carrier 100 is removed, different from the previous embodiment, only a redistribution layer 210' is formed in or on the dielectric layer 202 at this time, without manufacturing final circuit output like contact pads 510. The redistribution layer 210' manufactured therefrom is electrically connected with the BEOL interconnect 208 in the dielectric layer 202.

Figure 12:
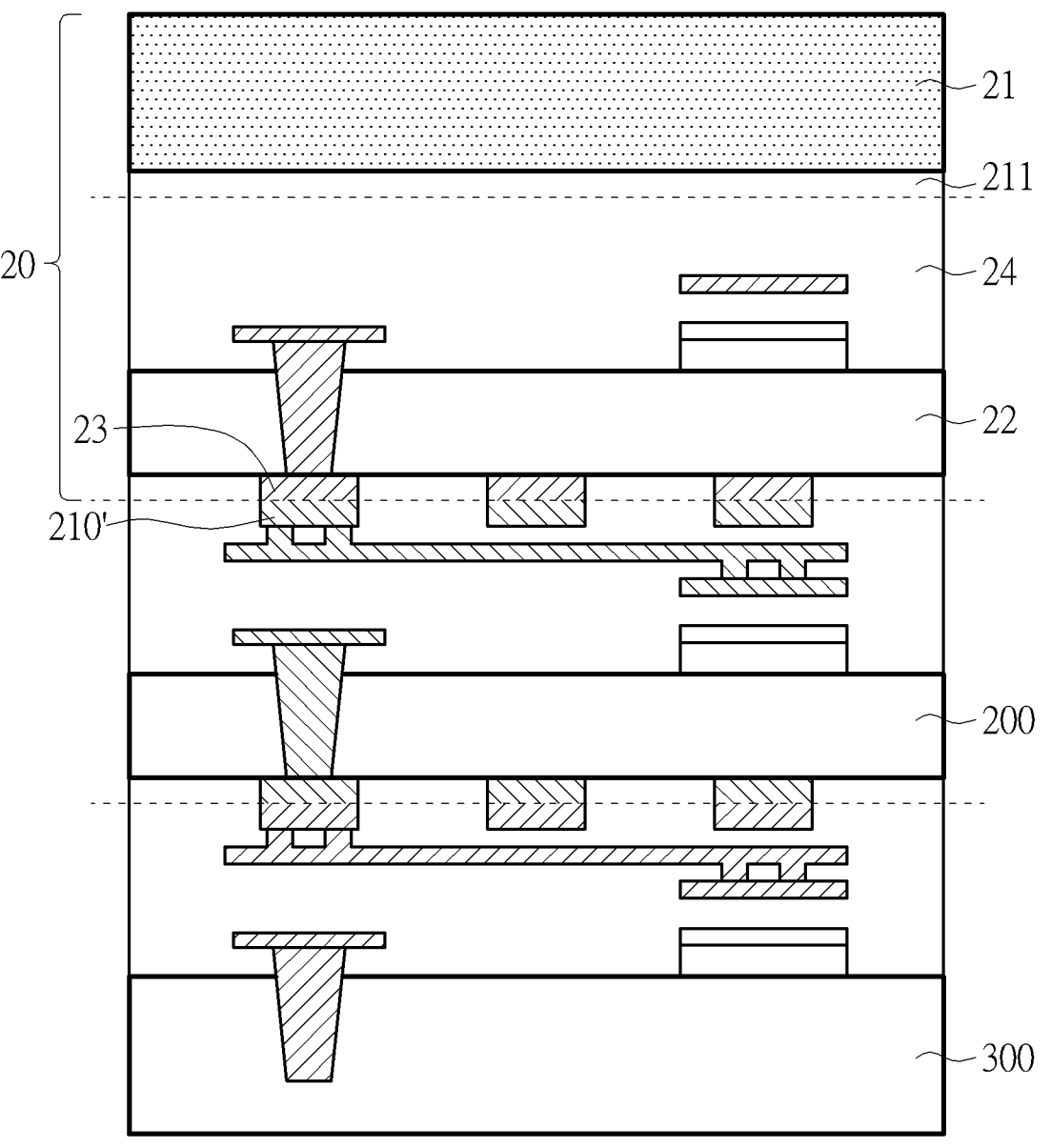

Please refer to FIG. 12. After the redistribution layer 210' is formed, another wafer bonding unit 20 is then bonded on the redistribution layer 210. The wafer bonding unit 20 has identical structure as the one of aforementioned wafer bonding unit 10, including sacrificial 21, carrier silicon oxide layer 211, dielectric layer 24, silicon substrate 22, redistribution layer 23, etc. The wafer bonding unit 20 is also bonded with the redistribution layer 210' of corresponding silicon substrate 200 through its redistribution layer 23.

Figure 13:
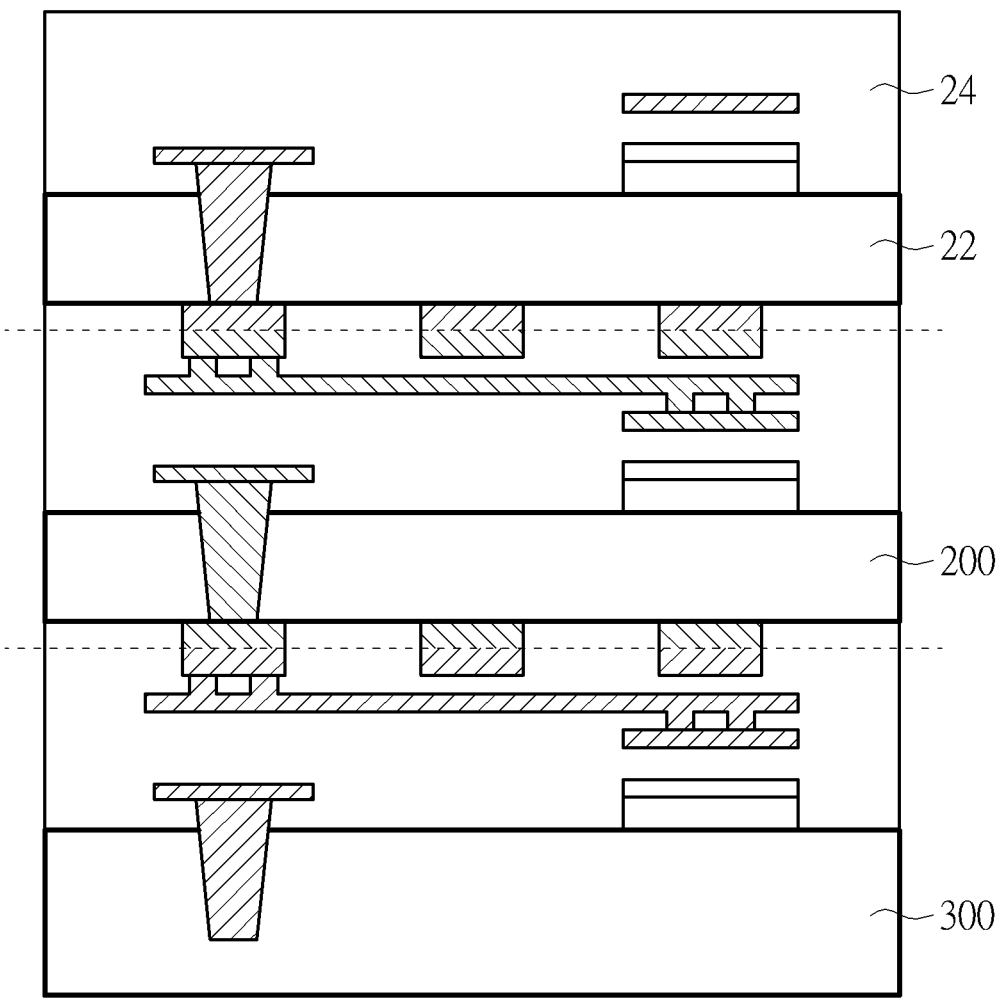

Please refer to FIG. 13. After bonding another wafer stacking unit 20, the steps of removing the sacrificial carrier in FIG. 10, forming the redistribution layer in FIG. 11 and bonding another wafer bonding unit in FIG. 12 may then be repeated to stack more wafers on entire structure. Please note that the number of bondable silicon substrate is not limited in the present invention. FIG. 13 only shows three silicon substrates 200, 300, 22 as an exemplary embodiment.

Figure 14:
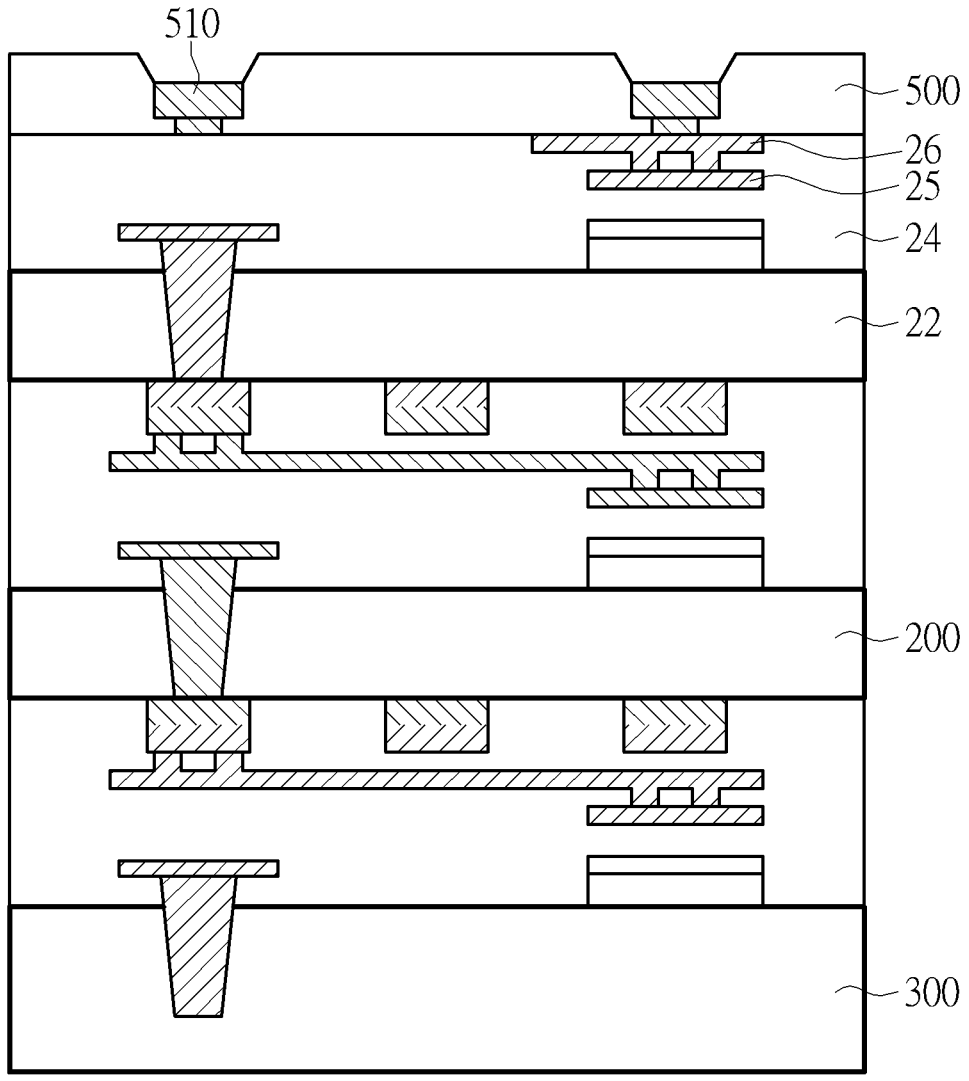

Please refer to FIG. 14. After bonding the last wafer bonding unit and removing its sacrificial carrier 21, as the step shown in FIG. 7, circuit outputs of the entire wafer stacking structure are manufactured. A redistribution layer 26 is formed in or on the silicon oxide layer 211 or the topmost dielectric layer 24, electrically connecting with the BEOL interconnect 25 in the dielectric layer 24. Contact pads 510 may be further formed on the redistribution layer 26 to function as final circuit outputs of the wafer stacking structure. A passivation layer 500 may be further formed on the outermost surface to provide protection effect. Accordingly, the wafer stacking process of present invention is therefore completed.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A wafer stacking process, comprising:
providing a sacrificial carrier;
forming a silicon oxide layer on a front side of said sacrificial carrier;
providing a silicon substrate, wherein said silicon substrate is provided with through silicon vias (TSVs), and back-end-of-line (BEOL) interconnects and a dielectric layer are provided on a front side of said silicon substrate;
bonding said silicon oxide layer on said front side of said sacrificial carrier with said dielectric layer on said front side of said silicon substrate;
performing a thinning process on a back side of said silicon substrate to remove parts of said silicon substrate and expose said TSVs inside;
forming a redistribution layer on said back side of said silicon substrate after said TSVs are exposed by said thinning process;
bonding said back side of said silicon substrate with a front side of another silicon substrate, wherein said TSVs of said silicon substrate are electrically connected with BEOL interconnect on said front side of said another silicon substrate through said redistribution layer;
repeating aforementioned said thinning process and said process of bonding another silicon substrate, thereby forming a wafer stacking structure; and
performing a removing process to completely remove said sacrificial carrier.

2. The wafer stacking process of claim 1, wherein said sacrificial carrier is a silicon substrate, and said silicon oxide layer is a thermal oxide layer.

3. The wafer stacking process of claim 1, wherein said sacrificial carrier is a glass substrate, and said silicon oxide layer is a deposited oxide layer.

4. The wafer stacking process of claim 1, wherein said process of removing said sacrificial carrier comprises chemical mechanical planarization process, dry etching process or wet etching process.

5. The wafer stacking process of claim 1, further comprising forming a passivation layer or contact pads on topmost said dielectric layer on said wafer stacking structure or on said silicon oxide layer of said sacrificial carrier after removing said sacrificial carrier.

6. A wafer stacking process, comprising:
providing a sacrificial carrier;
forming a silicon oxide layer on a front side of said sacrificial carrier;
providing a silicon substrate, wherein through silicon vias (TSVs) are formed in said silicon substrate, and back-end-of-line (BEOL) interconnects and a dielectric layer are provided on a front side of said silicon substrate;
bonding said silicon oxide layer on said front side of said sacrificial carrier with said dielectric layer on said front side of said silicon substrate;
performing a thinning process on a back side of said silicon substrate to remove parts of said silicon substrate and expose said TSVs inside, wherein said sacrificial carrier and said silicon substrate after bonding form a wafer bonding unit;
bonding said silicon substrate of said wafer bonding unit with a front side of another silicon substrate, wherein said TSVs of said wafer bonding unit are electrically connected with BEOL interconnects on said front side of said another silicon substrate;
completely removing said sacrificial carrier of said wafer bonding unit;
forming a redistribution layer on said dielectric layer of said silicon substrate or on said silicon oxide layer remained on said silicon substrate to connect said BEOL interconnects on said front side of said silicon substrate;
bonding another wafer bonding unit on said redistribution layer, wherein said redistribution layer is electrically connected with TSVs of said another wafer bonding unit; and
repeating aforementioned said processes of removing sacrificial carrier, forming a redistribution layer and bonding another wafer bonding unit, thereby forming a wafer stacking structure.

7. The wafer stacking process of claim 6, wherein said sacrificial carrier is a silicon substrate, and said silicon oxide layer is a thermal oxide layer.

8. The wafer stacking process of claim 6, wherein said sacrificial carrier is a glass substrate, and said silicon oxide layer is a deposited oxide layer.

9. The wafer stacking process of claim 6, wherein said process of removing said sacrificial carrier comprises chemical mechanical planarization process, dry etching process or wet etching process.

10. The wafer stacking process of claim 6, further comprising forming contact pads on a redistribution layer connecting with said BEOL interconnect of the last said wafer bonding unit.

* * * * *